(12) United States Patent
Clark

(10) Patent No.: US 7,289,332 B2
(45) Date of Patent: Oct. 30, 2007

(54) MIRROR IMAGE ELECTRICAL PACKAGES AND SYSTEM FOR USING SAME

(75) Inventor: Charles Clark, Westland, MI (US)

(73) Assignee: Liberty University, Lynchburg, VA (US)

( * ) Notice: Subject to any disclaimer, the term of this patent is extended or adjusted under 35 U.S.C. 154(b) by 364 days.

(21) Appl. No.: 10/869,533

(22) Filed: Jun. 16, 2004

(65) Prior Publication Data

US 2005/0281012 A1    Dec. 22, 2005

(51) Int. Cl.
  H05K 7/02 (2006.01)
  H05K 7/06 (2006.01)
  H05K 7/08 (2006.01)
  H05K 7/10 (2006.01)

(52) U.S. Cl. ................ 361/783; 361/760; 361/777

(58) Field of Classification Search .............. None
See application file for complete search history.

(56) References Cited

U.S. PATENT DOCUMENTS

| | | | |
|---|---|---|---|
| 4,651,416 A | | 3/1987 | DePaul |
| 4,994,896 A | * | 2/1991 | Uemura et al. ............ 257/724 |
| 5,012,389 A | | 4/1991 | Perry |
| 5,309,020 A | * | 5/1994 | Murasawa et al. ......... 257/685 |
| 5,383,148 A | | 1/1995 | Testa et al. |
| 5,502,621 A | | 3/1996 | Schumacher et al. ...... 361/760 |
| 5,585,667 A | | 12/1996 | Asanasavest |
| 5,644,102 A | * | 7/1997 | Rostoker ................... 174/547 |
| 6,148,509 A | | 11/2000 | Schoenfeld et al. |
| 6,192,431 B1 | | 2/2001 | Dabral et al. |
| 6,344,976 B1 | * | 2/2002 | Schoenfeld et al. ........ 361/813 |
| 6,442,056 B2 | | 8/2002 | Nuxoll et al. ................. 365/52 |
| 6,894,379 B2 | * | 5/2005 | Feurle ........................ 257/686 |
| 6,948,137 B2 | * | 9/2005 | Kikuchi .......................... 716/1 |
| 6,979,910 B2 | * | 12/2005 | Shirasaka ................... 257/797 |

FOREIGN PATENT DOCUMENTS

| | | | |
|---|---|---|---|
| JP | 01076748 A | * | 3/1989 |
| JP | 06140566 A | * | 5/1994 |

OTHER PUBLICATIONS

Google Search Results on "Reversed Pinout TSOP," generated Apr. 9, 2007, 71 pages.
AMD IC Package Codes, "Part Number System for Reversed Pinout SOIC," Packages and Packing Publication Revision A, Mar. 1, 2003.
AMD, "Part Number System for Reversed Pinout SOP," undated.
B. Qureshi, et al., "AP-607 Application Note: Multi-Site Layout Planning with Intel's FlashFile(TM) Components, Including ROM Compatibility," Dec. 1995.
AMD Publication #21445, Rev: B, Amendment +2, "AM29F040B 4 Megabit (512 K×8-Bit) CMOS 5.0 Volt-only, Uniform Sector Flash Memory," Apr. 1998.

(Continued)

*Primary Examiner*—Tuan T. Dinh
(74) *Attorney, Agent, or Firm*—Wong, Cabello, Lutsch, Rutherford, & Brucculeri, LLP

(57) ABSTRACT

A mirror image package is disclosed along with several embodiments for using such package in connection with a normal package. Embodiments include side-by-side and top-over-bottom mounting arrangements. Embodiments also include color or graphic coding so that normal and mirror image chips may be easily distinguished.

26 Claims, 20 Drawing Sheets

OTHER PUBLICATIONS

AMD Publication #21504, Rev: E, Amendment/+1, "AM29F800B 8 Megabit (1 M×8-Bit/512 K×16-Bit) CMOS 5.0 Volt-only, Boot Sector Flash Memory," Aug. 4, 2000.

Hyundai Semiconductor; Hyundai Product Description Rev: 03, "HY29F400T/B Series: 4 Megabit 5.0 volt-only Sector Erase Flash Memory," Aug. 97.

Intel(r) Small Outline Package Guide, "SOP Layout Features and Applications," 1999.

NEC Electronics Corporation, "Product Data Sheet: MOS Integrated Circuit uPD43256B—256K-Bit CMOS Static RAM 32K-Word By 8-Bit," Document No. M10770EJEV0DS00 (14th edition), Jun. 2006.

Fujitsu Semiconductor Data Sheet, "Flash Memory: CMOS 2 M (256 K×8) Bit MBM26LV002T-12-x/MBM29LV002B-12-x," undated.

Mitsubishi Electric; "Mar. 25, 1997 Mitusubishi LSIs M5M51008BP, FP, VP, RV, KV, KR -55L, -70L, -10L, -55LL, -70LL, -10LL: 1048576-BIT (131072-Word By 8-Bit) CMOS Static RAM," 1997.

Cypress Semiconductor Corporation, "CY62256: 32K×8 Static RAM," Feb. 18, 2002.

STMicroelectronics, "M29F040: 4 Mbit (512Kb×8, Uniform Block) Single Supply Flash Memory," Nov. 1999.

RF Micro Devices; "W-LAN/Bluetooth: Internix Newsletter No. 90," undated.

Pro Systems, "Mirrored Pinout to simplify circuit board layout," undated.

Micron Semiconductor Products, Inc., "Rambus(r) DRAM: 128Mb/144: 8 MEG×16/18 RDRAM," copyright 2000.

Cypress Semiconductor Corporation; "QDR SRAM: Assembly Considerations;" Jun. 2001.

Effy Deal Global Co., Ltd, "QDR SRAM: Assembly," copyright 2006.

Google Search Results on "Mirrored Pinout," generated on Apr. 10, 2007.

* cited by examiner

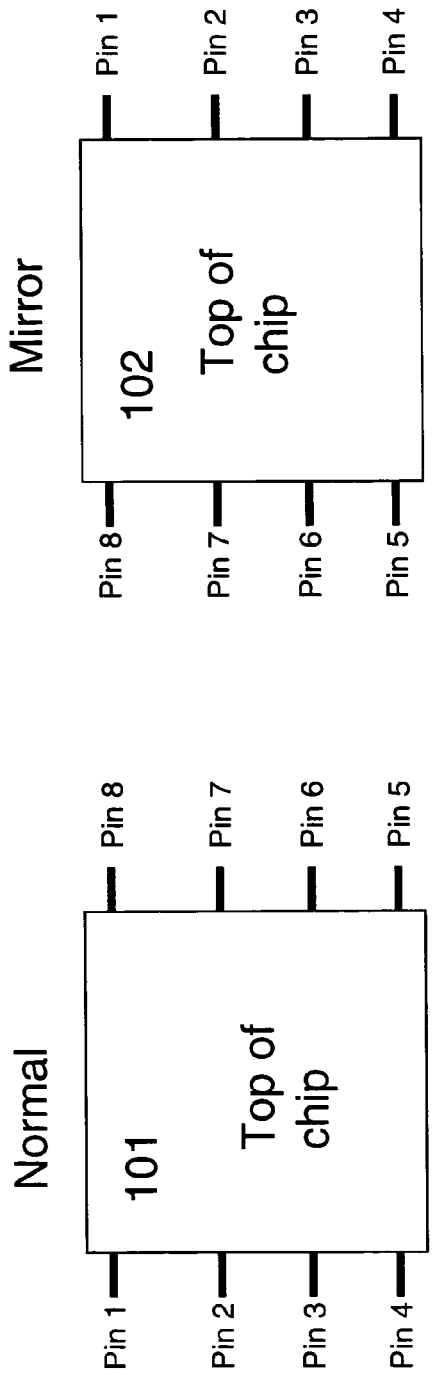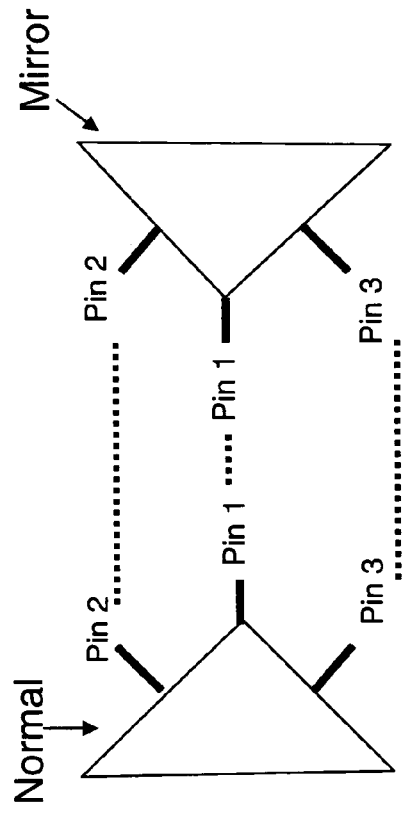
Figure 1

Figure 3A

Normal
Top of chip

| R1 C4 | R2 C4 | R3 C4 | R4 C4 |
|---|---|---|---|
| R1 C3 | R2 C3 | R3 C3 | R4 C3 |
| R1 C2 | R2 C2 | R3 C2 | R4 C2 |
| R1 C1 | R2 C1 | R3 C1 | R4 C1 |

Figure 3B

Mirrored
Top of chip

| R1 C1 | R2 C1 | R3 C1 | R4 C1 |
|---|---|---|---|
| R1 C2 | R2 C2 | R3 C2 | R4 C2 |
| R1 C3 | R2 C3 | R3 C3 | R4 C3 |
| R1 C4 | R2 C4 | R3 C4 | R4 C4 |

Figure 3

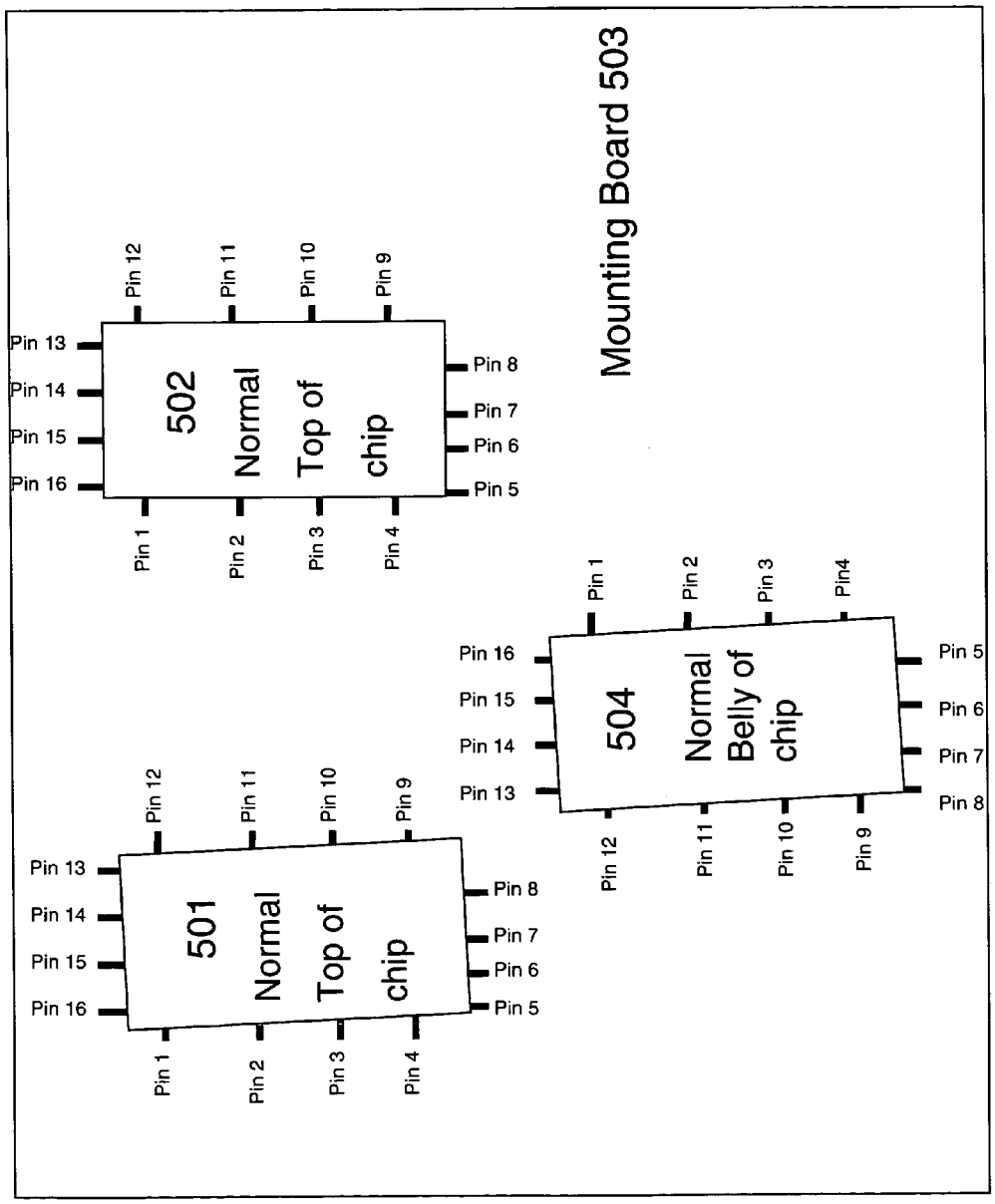
Chip A  Figure 5

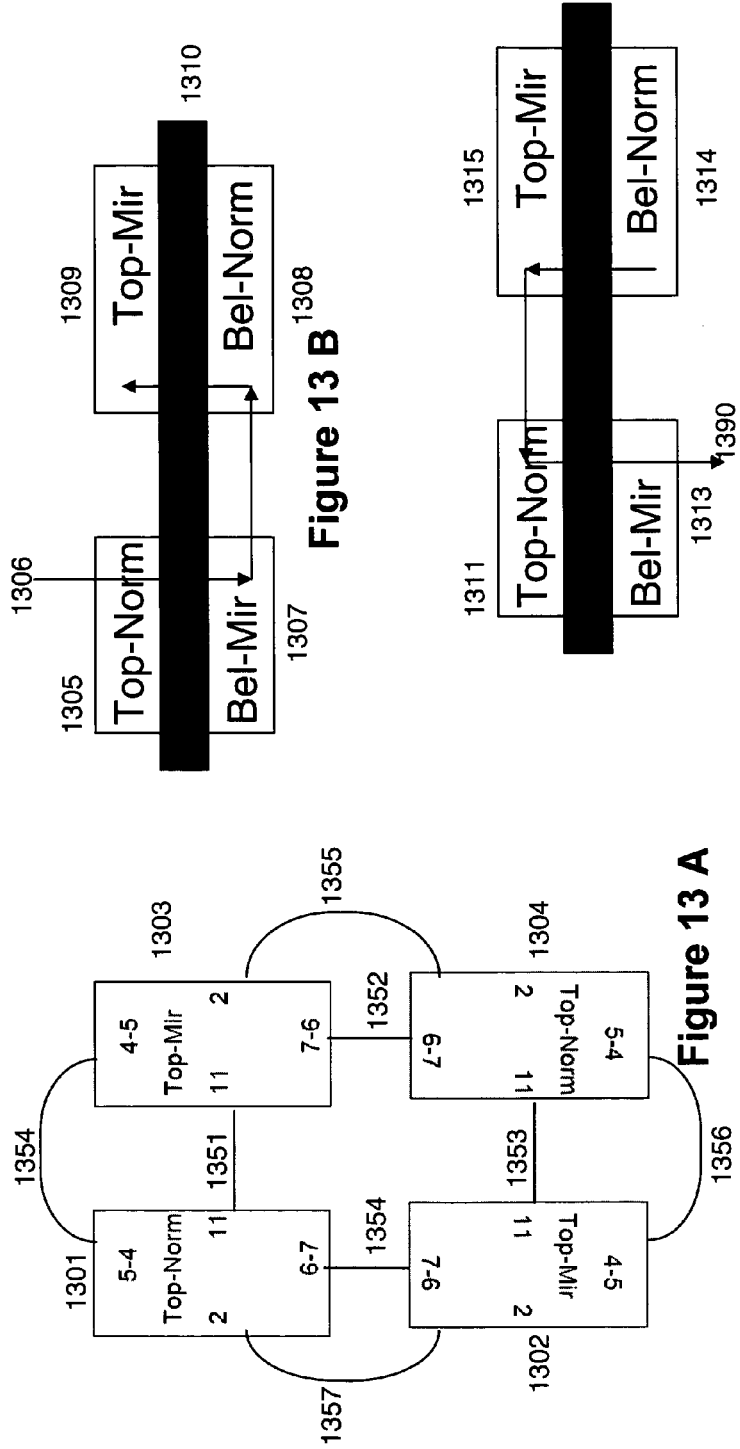

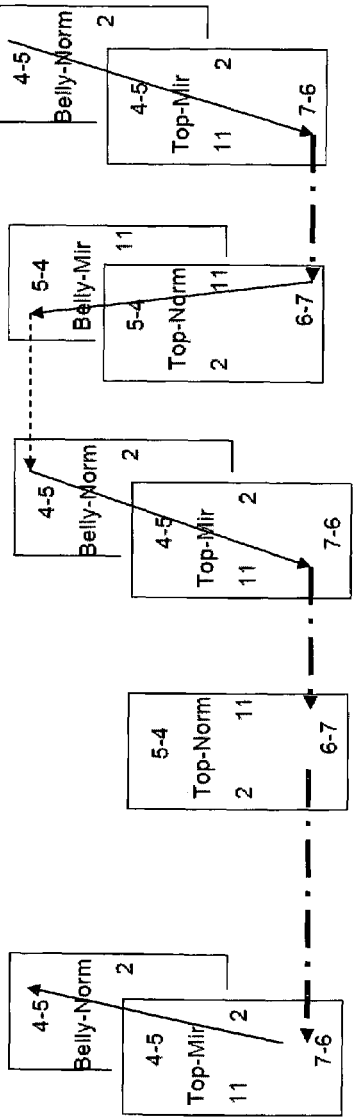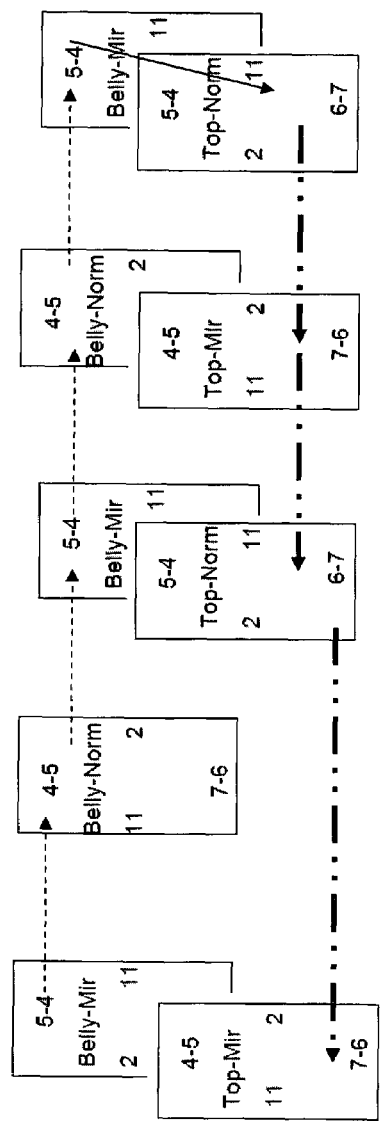
Figure 16

MIRROR IMAGE ELECTRICAL PACKAGES AND SYSTEM FOR USING SAME

BACKGROUND OF THE INVENTION

In the fields of electronics and electrical devices, most manufactured products comprise a variety of sub-components that require interconnection. For many products the number of these sub-components can be very large while the overall size of the manufactured product is relatively small. This is particularly true for electronic goods, which typically comprise mounting boards (e.g. printed circuit boards) that facilitate the interconnection of many semiconductor chips and other electrical components. Each component on such a mounting board may have numerous connectors (from just a few to several hundred), making the task of interconnections a challenge, even in the absence of constraints such as size and electrical characteristics.

Due to the nature of electronics design, mounting boards (such as printed circuit boards) often carry several functionally identical components. For example a contemporary memory DIMM board may carry several identical DRAM chips. Many of the connectors on these chips are common to all identical chips on the board (e.g. data, address, clock, reset, power and ground connectors). Referring to FIG. 17, there are shown two normal 16-lead quad packages for which anyone might imagine the difficulty of interconnecting identically-numbered leads (i.e. pin 1 chip A to pin1 chip B, pin 2 chip A to pin 2 chip B, pin 3 chip A to pin 3 chip B, and so on). In whatever interconnection scheme one might imagine, there will be crossed lines (connections) and/or lines running under the chips (between leads). For each place that lines cross, there is possible need of a via (connection through lower layers of the board) to make the interconnect in practice. As is evident in FIG. 17, substantial under-chip connections or via connectors will be necessary to connect common leads on two simple 16-lead devices. The problem exists to a lesser extent in smaller chips (such as an 8 pin dip) and compounds dramatically as the lead count and complexity of the chips increases (e.g. larger quad packs and BGAs). The problem is yet further exacerbated by two-sided configurations as shown in FIG. 5. Referring to FIG. 5, there is shown a mounting board 503. The mounting board 503 has three identical chips for mounting, two on top of the mounting board (chips 501 and 502); and one on the bottom of the mounting board (chip 504). It is evident that there is tremendous complexity in connecting the common numbered leads of the three chips pictured in FIG. 5 (chips 501 and 504 are shown tilted to indicate their relationship of top over bottom).

Without digressing into great detail that is well know in the art, the cost of mounting board design and manufacture rises with the complexity of the interconnections discussed. This is generally because of the number of layers and vias required to make interconnections without violating electrical specifications for such issues as cross-talk, impedance, inductance or capacitance.

In summary, the current state of the art is that surface mount and double-sided surface mount configurations are being used as an alternative to old through-hole PC boards. For a single type of chip. the chip suppliers generally only offer packages with the one pin-out (the configuration of leads around the chip and the correspondence of those leads to the functional elements of the chip). Therefore, board designers are faced with the problem illustrated in FIGS. 5 and 17, with the exception that the chips more typically have dozens or hundreds of leads that are packaged extremely densely. The results are (i) board designs that are monumental three dimensional problems; (ii) high costs to boards due to multiple layers, complex interconnects and design effort; and (iii) the failure of many products to come to market because layout complexities violate specifications, standards or cost constraints (e.g. testing failures).

There have been efforts to mitigate these problems, however, none have been terribly useful and widely commercialized. A prominent example of a common mitigation technique is to re-orient one or more chips on board so that common connections may be made more easily. This technique has limited efficacy (especially on high-lead-count designs) and generally increases the required board space. Another example is discussed in U.S. Pat. No. 5,502,621, which proposes a chip packaging design to aggregate functions in "mirror image" lead assignments. In particular, the '621 Patent proposes that two identical "mirror image" chips may be used to make board routing easier. This is simply a variation of the re-orientation technique. However, in addition to re-orienting the positioning of a chips on a board, the '621 Patent proposes re-orienting the position of leads on a chip, so that multiples of such chip may be more easily interconnected. Similarly, in the process of disclosing a test-related invention, U.S. Pat. No. 6,442,056 proposes classification of leads on a chip by their functional grouping (e.g. power, input output, input only etc.). In so proposing, the '056 Patent states that the "function assignment arrangement of a packaged semiconductor device according to the present invention is identical to the function assignment arrangement of a mirror image of that packaged semiconductor device" (Column 5, lines 4-8). The '056 Patent goes on to suggest that, if a test device shares the functional regions of the suggested semiconductor chips, the same test device may be used to test both members of a mirrored pair (Column 5, lines 26-28). Therefore, no damage would be caused if the wrong part of a mirrored pair was put in a tester because all the same functional sections would exist on the test head (Column 5, lines 56-64).

While these three alternative techniques may provide some mitigation to the layout and mounting problems discussed, there remains a need for further simplification. For example, there remains a need for parts with three or more common connections to be manufactured such that board layout and design are greatly simplified.

SUMMARY OF INVENTION

The inventions relate to the construction and use of mirror image configurations for devices that are mounted together on a mounting medium. In more particular embodiments, there is disclosed the construction of mirror image electronic chips by various techniques including by horizontally flipping a die in its normal package and adapting the internal bond-out. Furthermore, however constructed, there are disclosed several embodiments for using mirror image chip packages to reduce mounting board cost. Some disclosed embodiments show the use of mirror image chips wherein a chips pin-out is made as the true mirror image of a related chip and pin numbers transfer along with function. In other disclosed embodiments, mirror image chips are shown in connection with normal chips in side-by-side and top-over-bottom configurations. In yet other embodiments more complex configurations are discussed wherein both side-by-side and top-over-bottom techniques are exploited.

BRIEF DESCRIPTION OF THE DRAWINGS

FIGS. 1A, 1B, 1C and 1D are example devices illustrating some embodiments

FIGS. 3A and 3B are example devices illustrating some embodiments

FIG. 5 is an example of difficulties in the prior art FIGS. 16A and 16B are examples of interconnection of devices according to some embodiments

DETAILED DESCRIPTION

I. Mirror Image Chips

Figure 2:
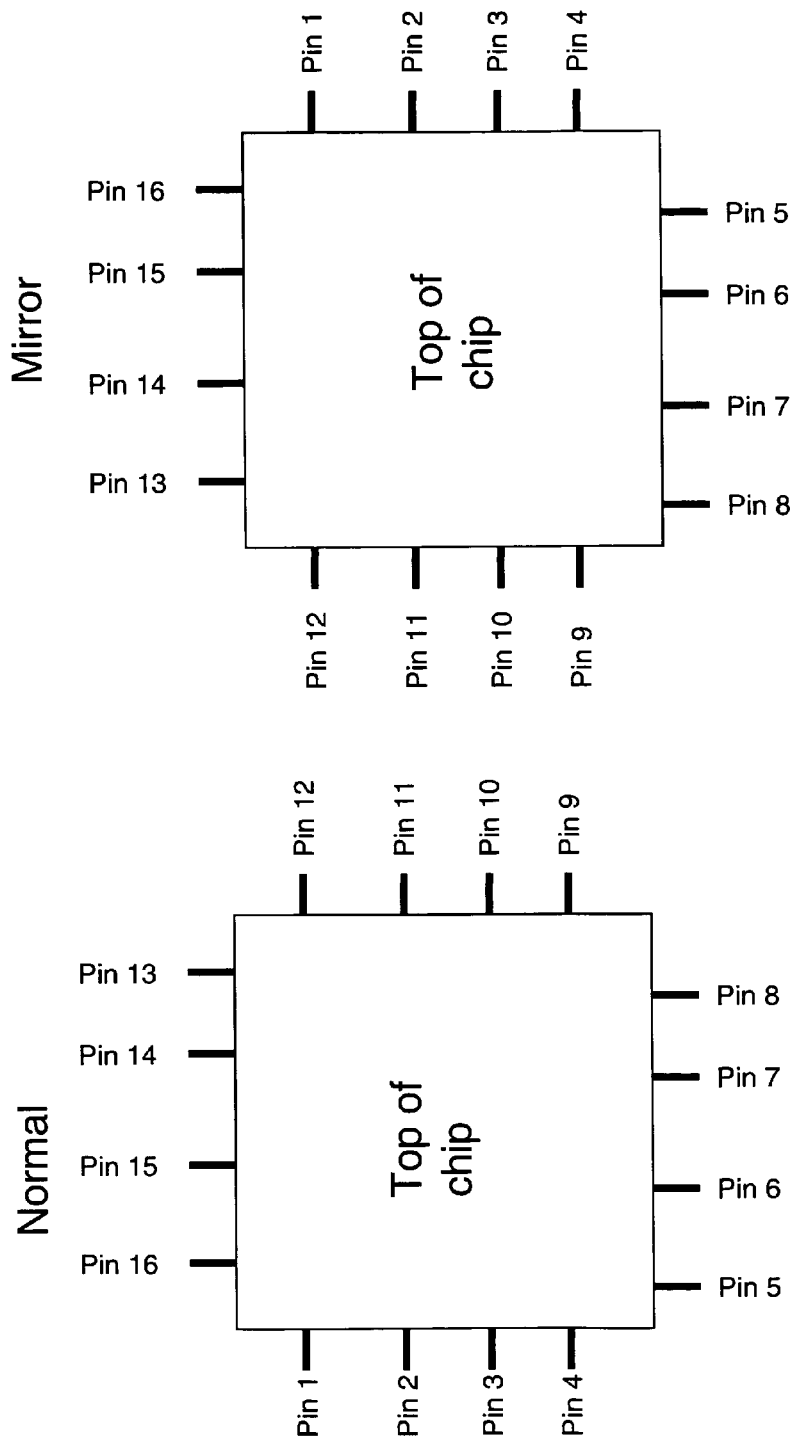
FIGS. 2A and 2B are example devices illustrating some embodiments

Given the published art and the state of colloquial American English, there may be confusion regarding the term "mirror image" as it relates to devices for connection with a mounting board. Therefore, we shall briefly explain the usage of this term in the context of the disclosed embodiments. However, before beginning such brief explanations, we shall discuss some of the nomenclature we exploit. Foremost, when picturing a chip, we generally show lead numbers to aid in functionally orienting the chip on the page. When we display a mirror image of the same chip, it will geometrically appear very similar to the non-mirrored version. However, the lead numbers will appear in different places on the similar geometry. These illustrations are intended to show the proposed relocation of a particular lead on the same geometric shaped device. In particular, if lead number 1 has a power function and is located in the top right corner of a rectangular chip, then the mirrored chip may show lead 1 in the top left corner of a rectangular chip. The intent of the illustration is to convey that the identical power functionality of lead 1 has been moved to another position for creating the mirrored chip.

In practice, chip leads are numbered and each has a purpose or function that is specified by the manufacturer of the chip. For example, the manufacturer of a chip may provide a specification that states lead (or pin) 1 is power VCC 5 volts and lead or pin 2 is address 01. Often the specification will include various timing and electrical parameters for each lead. Nevertheless, for many embodiments, when we discuss corresponding leads on two devices, we are generally referring to leads (or pins) sharing the same specification information. While we use lead numbers on varying versions of a chip (e.g. mirrored or normal) to indicate the relative positioning of a specified chip function, in practice (and in some embodiments) lead numbers could remain tied only to geometry, while specified function moves.

Furthermore, within certain embodiments of the invention, a mirrored chip need not be functionally or geometrically identical to the original: (i) its shape only need be sufficient to place a mirrored lead in a mirrored position approximate to the location where that lead would reside if the chip were mirrored in identical geometry; and (ii) functionally dissimilar parts may be more easily interconnected using mirrors because corresponding power, ground or data pins may align notwithstanding the dissimilar functions (e.g a memory chip and a memory controller).

In addition, many illustrations throughout this disclosure discuss leads on packaging. However, the embodiments described are not intended to be limited by such language. In particular, the inventions apply to all manner of objects requiring interconnection by physical medium. Most notably, characterizations of leads and packages are not intended to exclude flip chips or other versions of non-packaged or partially packaged die.

a. Simple Chips

The concepts described herein may apply to very simple chips and very complex chips. Referring to FIGS. 1C and 1D, there are two chip packages shown. Referring to normal package 1C and full mirror package 1D, both simple chips are shown with there top side up, so that they are visible as if they were soldered down on to a mounting board. Full mirror chip 1D has a lead layout that is the full mirror image of normal chip 1C. A full mirror image may be conceptualized in at least two ways. First, one can envision flipping the normal chip 1C over from side to side and adapting the package so that the belly side of chip 1C is the top side of chip 1D. Alternatively, one may envision what normal chip 1C would look like in an actual mirror. In either case, FIG. 1D is intended to show a full mirror package for the chip pictured in FIG. 1C. However envisioned, it is clear that using mirror image chip 1D makes interconnection with normal chip 1C easier than interconnection of two identical chips (the dashed lines show connections or respective pins 2 and 3; respective pins 1 may be connected under chip, over top, under bottom or by via).

b. Leads on Two Sides

Referring to FIGS. 1A and 1B, there are two more complex chip packages shown. Referring to normal package 101 and full mirror package 102, both chips are shown with their top side up, so that they are visible as if they were soldered down on to a mounting board. Full mirror chip 102 has a lead layout that is the full mirror image of normal chip 101. A full mirror image may be conceptualized in at least the following two manners. First, one can envision flipping the normal chip 101 over from side to side and adapting the package so that the belly side of chip 101 is the top side of chip 102. Alternatively, one may envision what chip 101 would look like in an actual mirror. In either case, FIG. 1B is intended to show a full mirror package for the chip pictured in FIG. 1A. It is noteworthy that a full mirror package might be created by simply rotating the die in the package and making allocation for that rotation in the bond-out and packaging process. The same technique (rotating die) may apply to any of the current or future variations of essentially unpackaged die that are exploited in dense device configurations. (e.g. flip chips).

Figure 4:
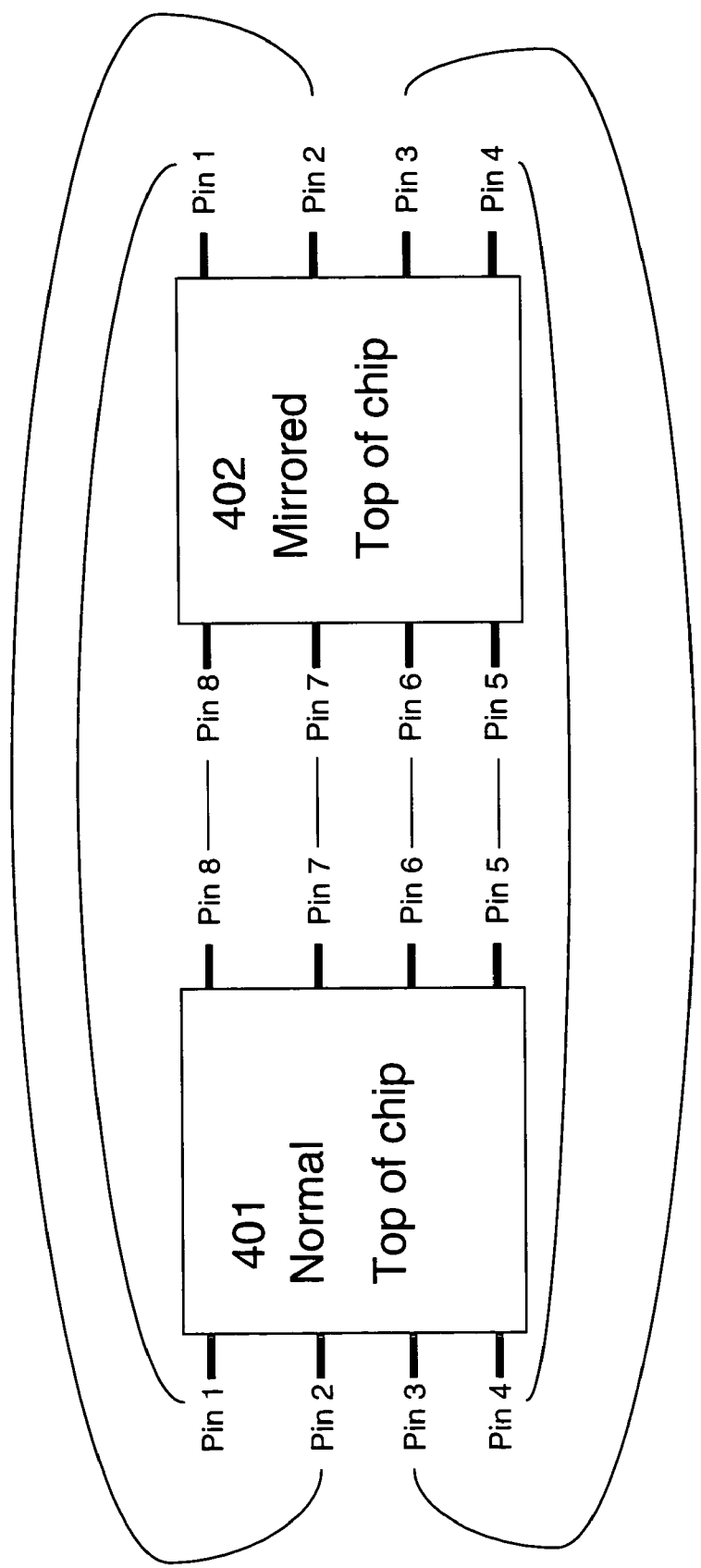
FIG. 4 is an example of interconnection of devices according to some embodiments
Figure 4A:
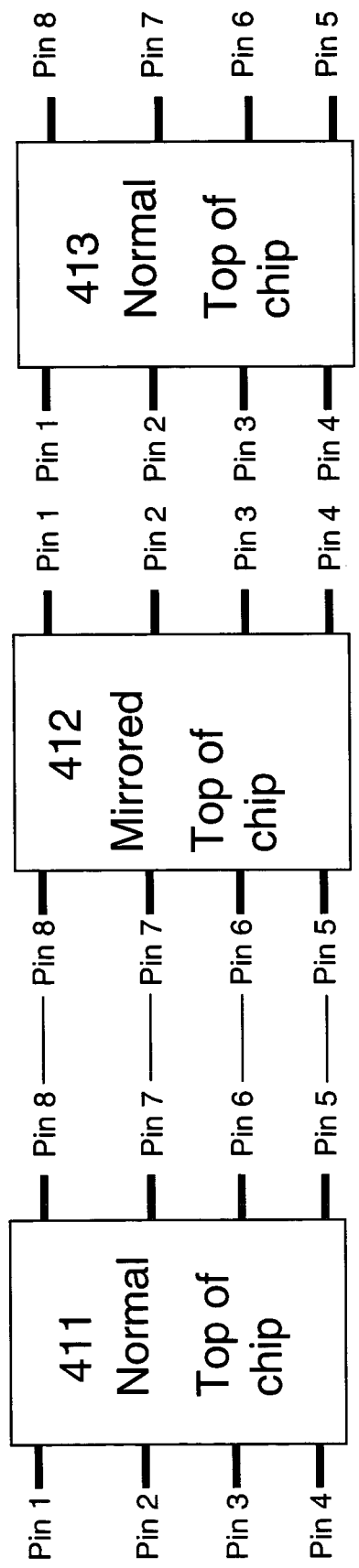
FIG. 4A is an interconnection illustration

Referring now to FIG. 4A, there are shown three chip packages in side-by-side configuration. As is evident from FIG. 4A, certain embodiments may have multiple chips side-by-side and achieve lay-out efficiency by placing a mirror chip between two normal chips. Of course, the same is true if a normal chip is placed between two mirror chips. While there are several ways to interconnect the chips as shown in FIG. 4A, it is easily seen that the number of layers and vias will be reduced by the use of the full mirror chip 412.

c. Leads on Four Sides

Referring now to FIG. 2, there are two quad-pack chips shown. In substance, these differ from FIG. 1 in that there are external leads on all four sides of the rectangular package. Of course, common rectangular packages for modern semiconductors typically have dozens or hundreds of leads. Furthermore, while illustrated and commonly occurring as rectangles, embodiments of the inventive concepts may apply to packages of any shape and with any distribution of leads around or under the shape. Referring now to FIG. 2A, there is a 16 lead, 4-sided chip shown with leads evenly distributed around the rectangle. The chip of FIG. 2A is the normal package version and, as before, it is shown top-up in a position that it would be applied onto a mounting board. Contrast now to FIG. 2B, which is the full mirror image version of the chip shown in FIG. 2A. This version may be envisioned and applied in a manner identical to that described above.

Figure 6:
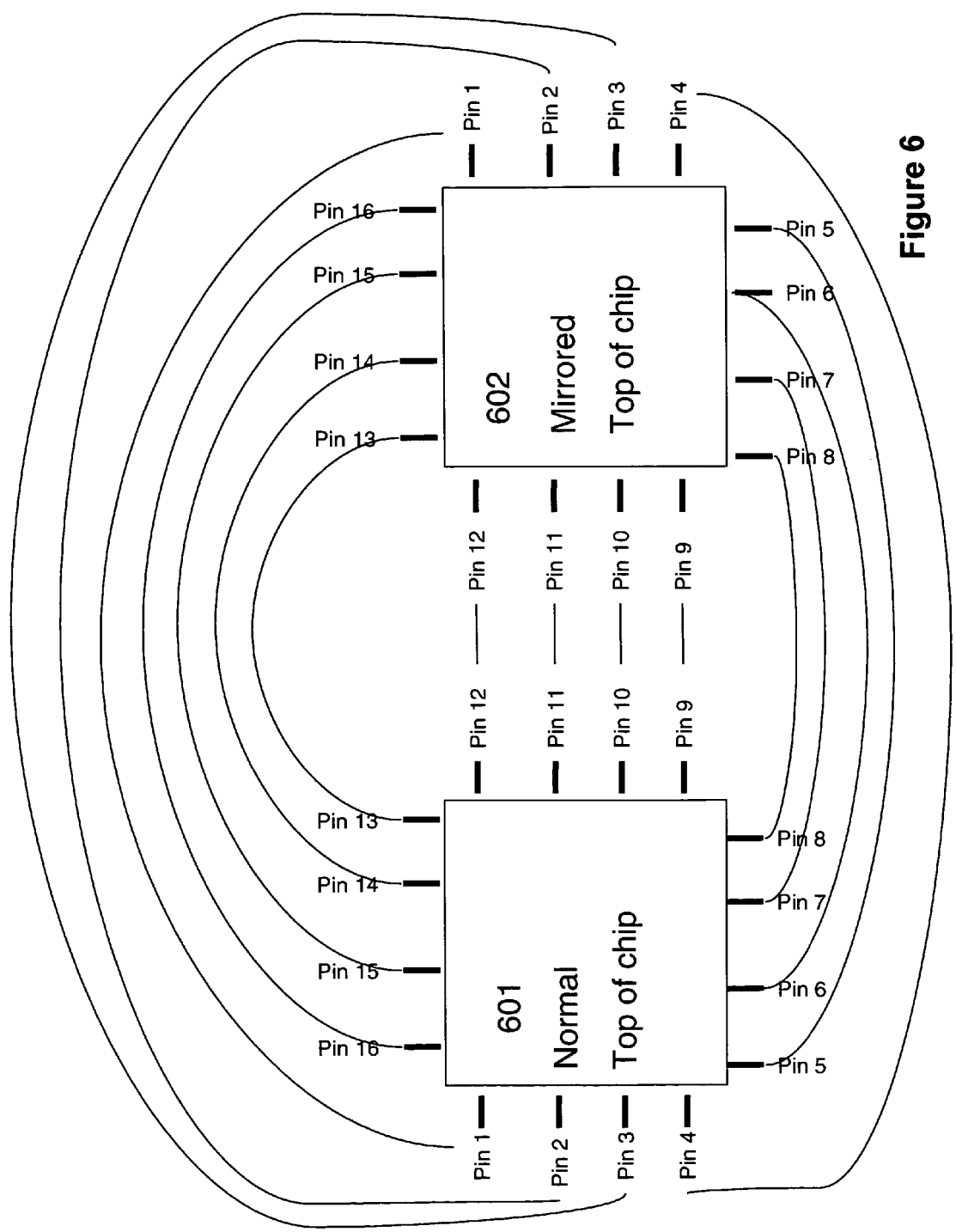
FIG. 6 is an example of interconnection of devices according to some embodiments
Figure 6A:
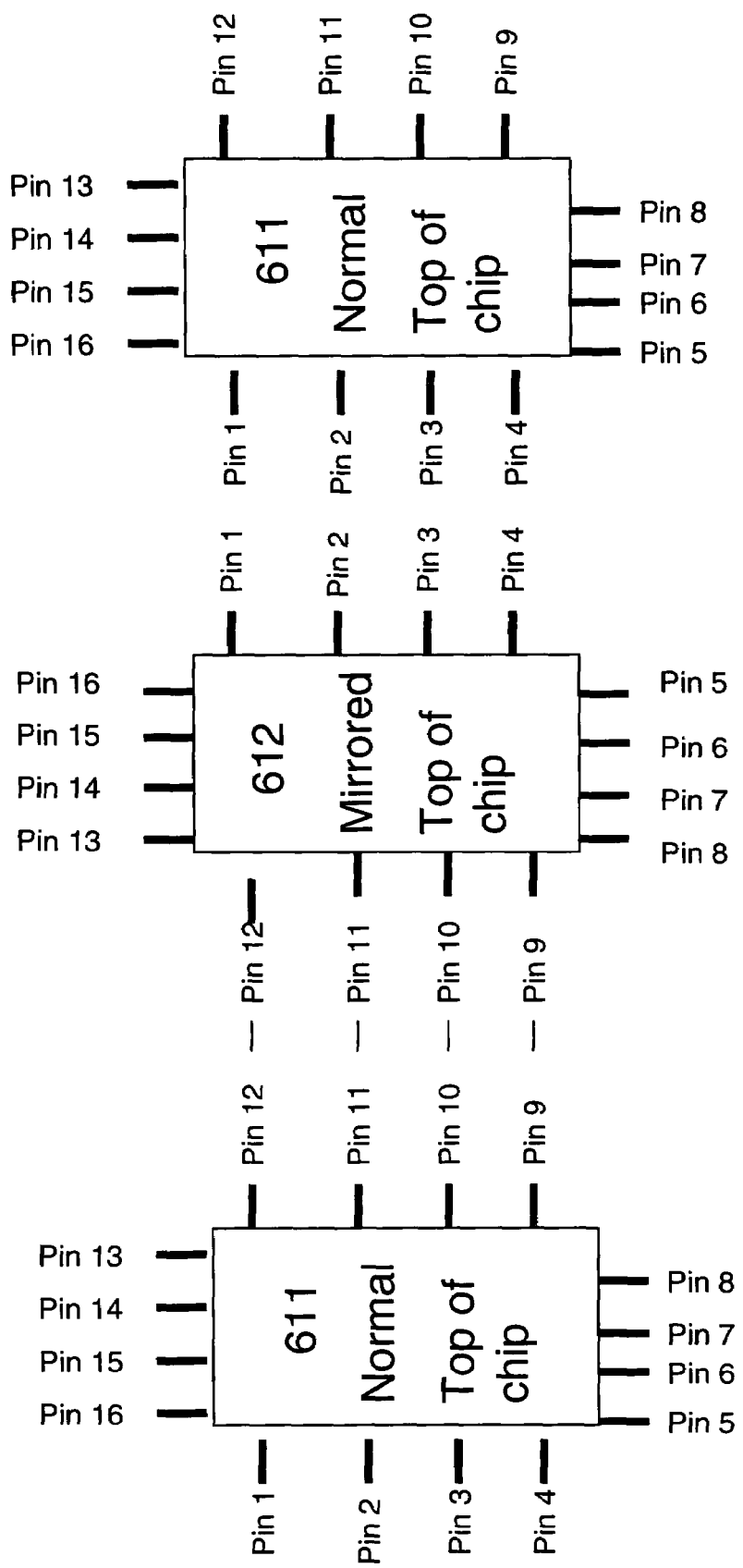
FIG. 6A is an interconnection illustration

Referring now to FIG. 6A, there are shown three chip packages in side-by-side configuration. As is evident from FIG. 6A, certain embodiments may have multiple chips side-by-side and achieve lay-out efficiency by placing a mirror chip between two normal chips. Of course, the same is true for a normal chip placed between two mirror chips. While there are several ways to interconnect the chips as shown in FIG. 6A, it is easily seen that the number of layers and vias will be reduced by the use of the full mirror chip 612.

d. Distributed Leads

There also exists a class of packaging where leads are distributed across the bottom of a chip. One common type of package using this connector technique is called a BGA or ball grid array. Two packages of this type are represented in FIG. 3. While more complicated to visualize, these types of chips are mirrored by the same techniques as previously discussed and are also applied similarly. For purposes of describing the nomenclature of the BGA-type chips, for ease of reference, we have use a row ("R") and column ("C") nomenclature. Therefore, pin number R1C1 is simply the pin occurring at row 1, column 1.

II. Using Mirror Image Chips

Having described configurations of full mirrored packages, we can now discuss applications.

a. Side-By-Side

Referring to FIG. 4, there is shown an embodiment for interconnecting corresponding leads of two side-by-side chips, where one chip is s full mirror of the other. As implied earlier, but expressly evident here, these connections are simple and require only connectors on a single level (e.g. metal trace on the surface of a mounting board). For completeness of discussion, we shall review some of the various embodiments illustrated by FIG. 4. The two chips 401 and 402 may be set side-by-side as shown (with respective leads 5, 6, 7 and 8 being adjacent) or alternatively, by reversing positions of the chips 401 and 402 so that respective leads 1, 2, 3, and 4 are adjacent. The outside set of leads, which are respective sets 1, 2, 3, and 4 as shown, may be interconnected as shown with some interconnections above the top and some interconnections below the bottom of the chips 401 and 402. It is important to note that the connections of the outside leads may be above the top or below the bottom in any proportion, including all interconnections made either way. In addition, while not fully realizing the benefits of the inventions herein, some embodiments may exploit any proportion of interconnections through vias or under the chips (i.e. traversing the area between the chip belly and the mounting board). Finally, it should further be noted that adjacent leads needn't be directly adjacent to realize the benefit of the inventive embodiments. In some embodiments, the adjacent leads may be staggered or angled with respect to each other.

Referring now to FIG. 6, there is shown an embodiment for interconnecting corresponding leads of two side-by-side chips like FIG. 4. However, the normal and full mirror chips shown in FIG. 6 both have leads on 4 sides of their rectangular shape (i.e. quad pack type packages). As shown in FIG. 6, the corresponding leads of normal chip 601 and Full mirror chip 602 may be interconnected on a single level. The chips 601 and 602 may exchange position and interconnect with the same efficiency (respective leads 1, 2, 3, and 4 would be adjacent in that case). As described with respect to FIG. 4, the interconnections may be made in any proportion above and below the chips. Furthermore, all interconnections (other than the adjacent leads 9, 10, 11 and 12) may be either above or below the chips. Lastly, as above, some embodiments may exploit any proportion of interconnections through vias or under the chips (i.e. traversing the area between the chip belly and the mounting board).

Figure 7:
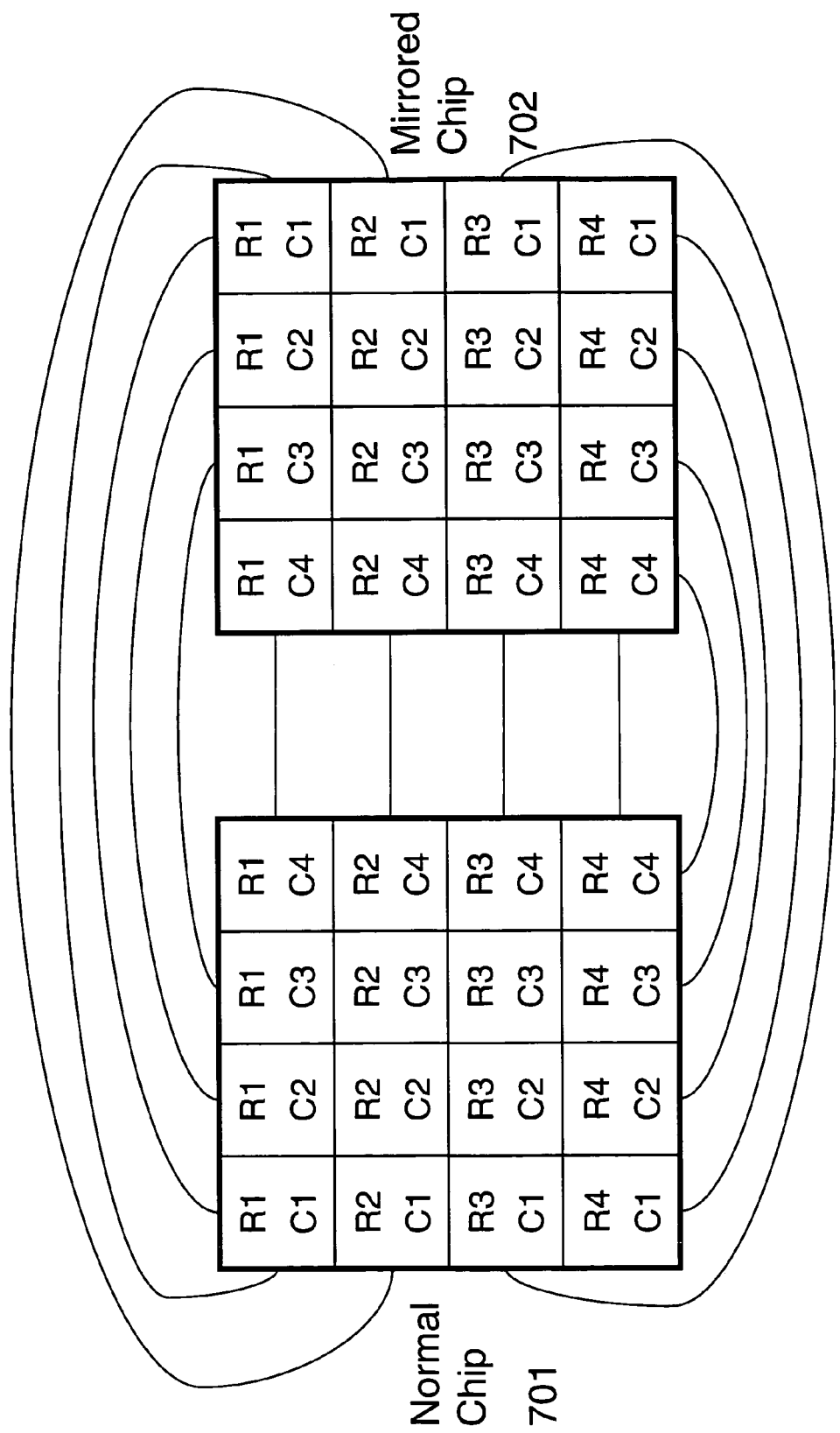
FIG. 7 is an example of interconnection of devices according to some embodiments

Referring now to FIG. 7, there is shown an embodiment for interconnecting corresponding leads of two side-by-side chips, where each of the chips has distributed leads across its under-belly (e.g. BGA type chips). These BGA type chips (normal chip 701 and full mirror chip 702) may have their outer-most leads interconnected as shown. With respect to BGA type chips, side by side interconnection efficiency is not as great as with the other chip formats. This is because interconnection of internal leads (e.g. R2C2, R2C3, R3C2 and R3C3) require either vias or connections under the chips. As we shall see, in some embodiments, these BGA type chips are best suited for top over bottom configuration. Nevertheless, with respect to the outermost leads, the comments regarding FIG. 6 apply.

b. Top Over Bottom

Figure 8:
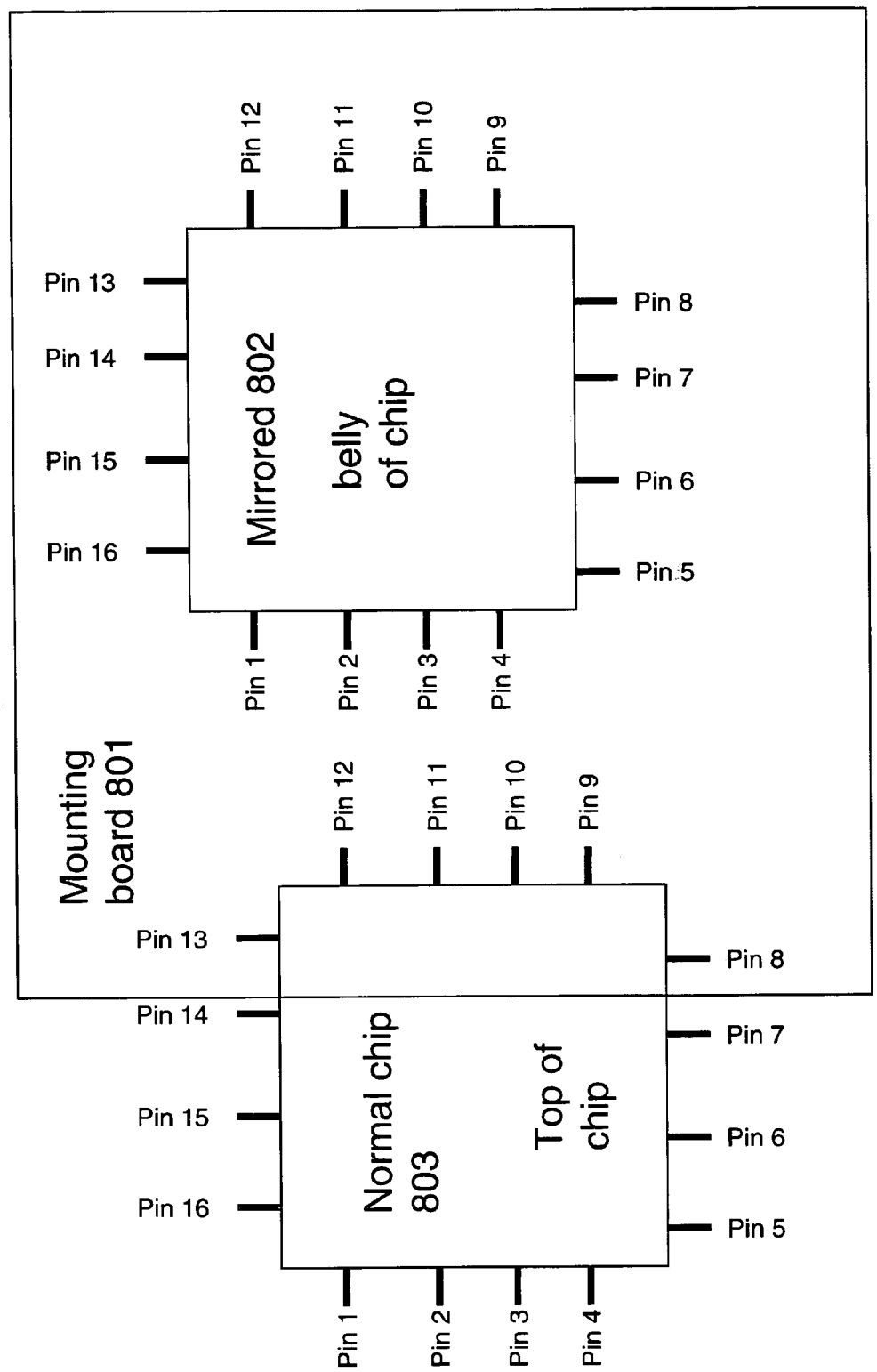
FIG. 8 is an example of interconnection of devices according to some embodiments
Figure 9:
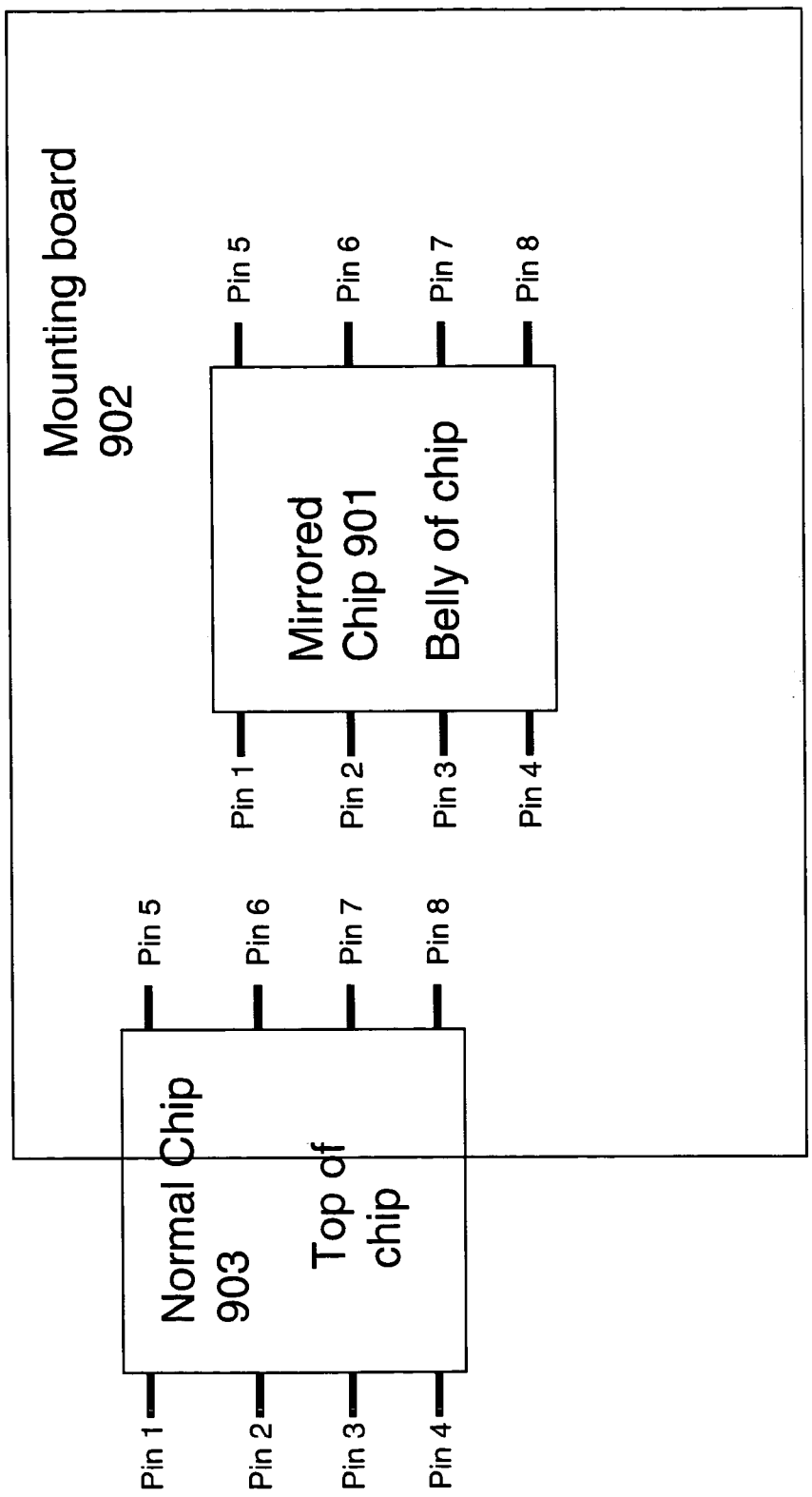
FIG. 9 is an example of interconnection of devices according to some embodiments
Figure 10:
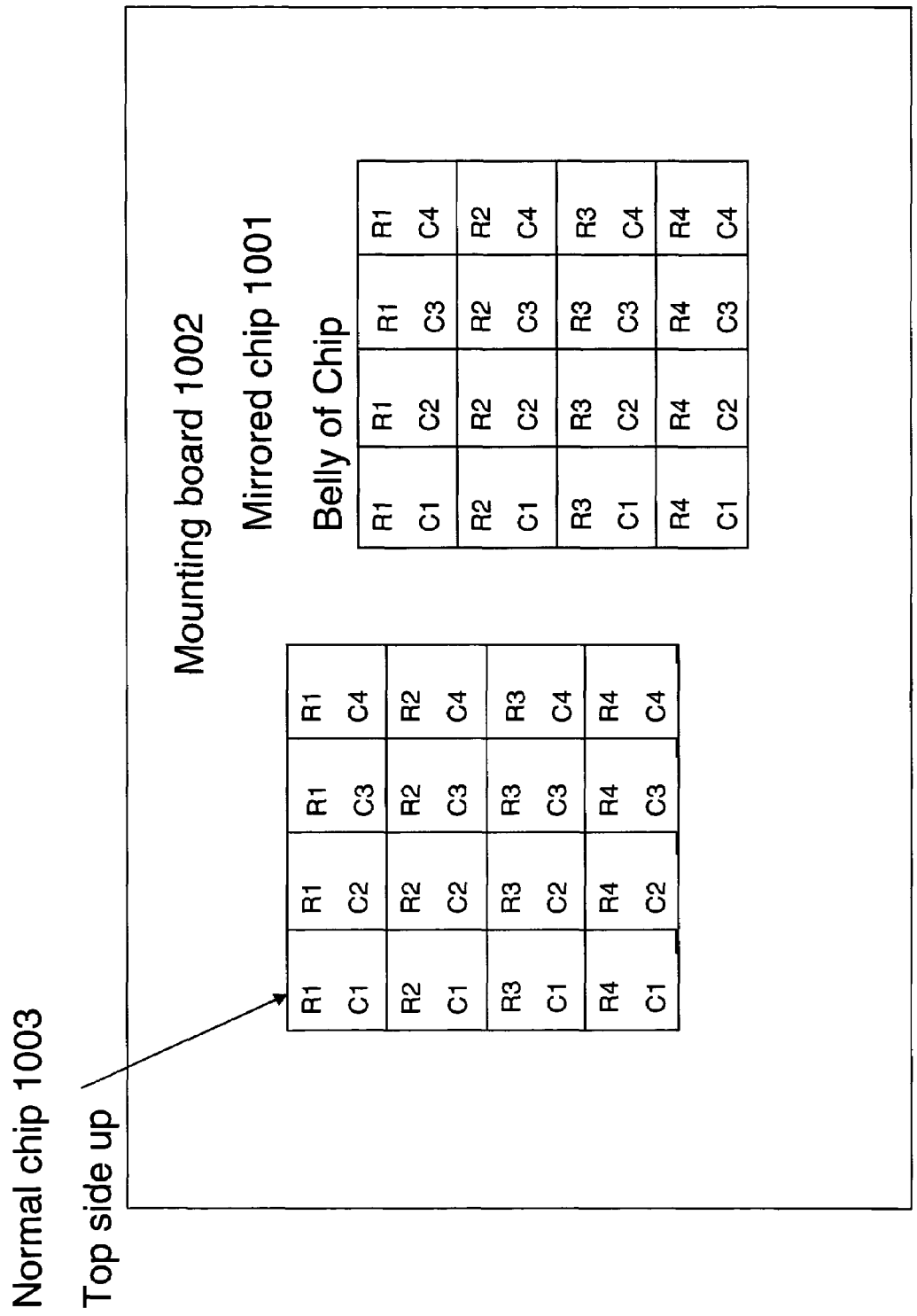
FIG. 10 is an example of interconnection of devices according to some embodiments

An important benefit to many of the disclosed embodiments is the ease with which a mirror image chip may be mounted top-over-bottom with a normal chip counterpart. Referring to FIG. 8, quad pack type normal chip 903 is shown top side up for mounting on the top side of mounting board 801. Full mirror chip 802 is shown for mounting belly side up on the bottom of mounting board 801. As is evident, all corresponding leads of chips 802 and 803 will align for interconnection through the mounting board, that interconnection being far easier than a case where chip 802 is not a full mirror. Furthermore, the chips 802 and 803 need not be precisely top-over-bottom in order to enjoy the benefits of this embodiment. In varying embodiments, the chips may be staggered in position or rotated slightly with respect to each other. The same principles apply to virtually any other type of chips as partly shown in FIGS. 9 and 10.

c. Three or More Chips

Figure 11:
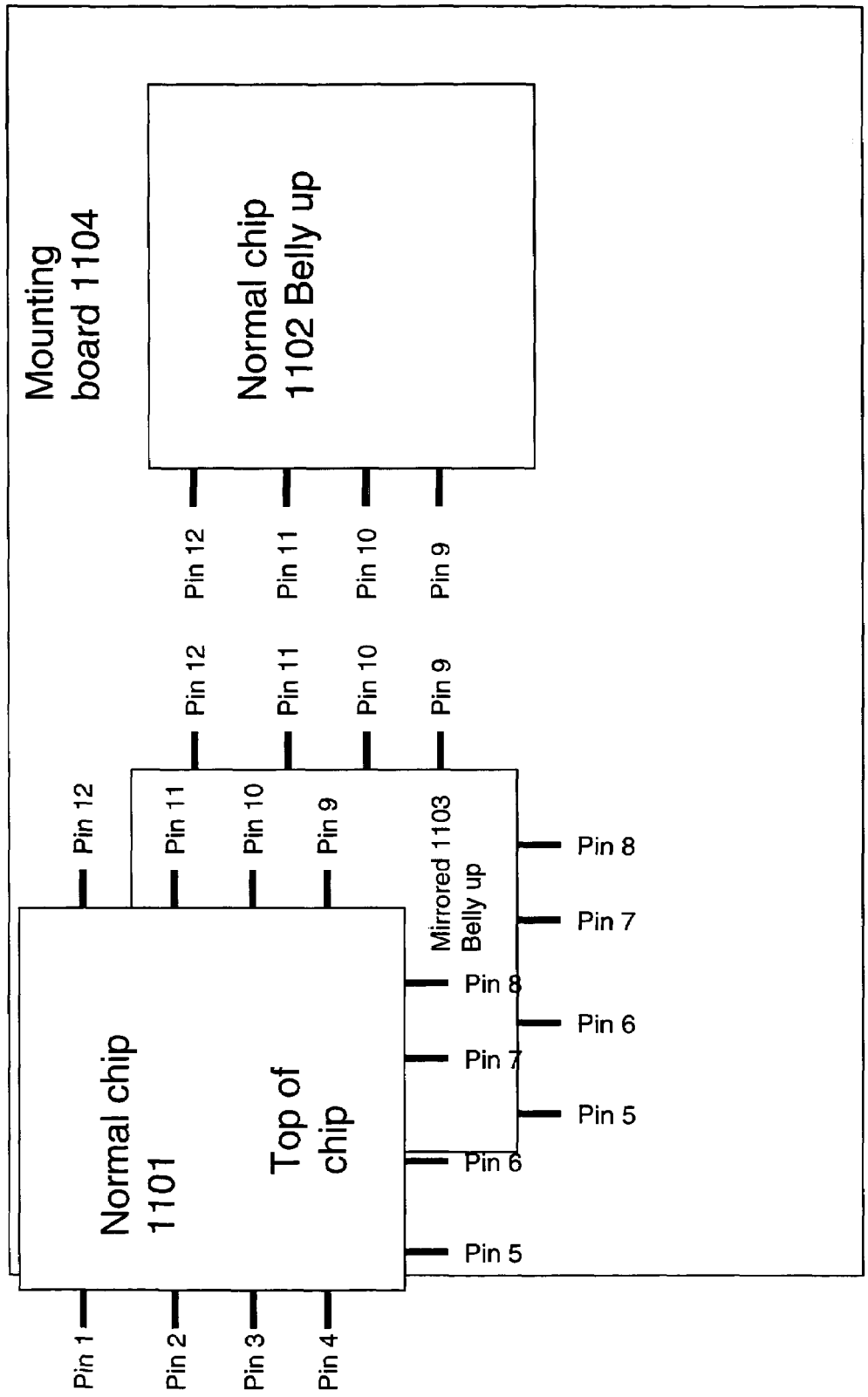
FIG. 11 is an example of interconnection of devices according to some embodiments

We have discussed varying embodiments to achieve efficiency in interconnecting chips that are either side-by-side or top-over-bottom. These two principles may also be combined. This type of combination is extremely valuable because there are many situations when common leads of three or more chips require interconnections. Referring to FIG. 11, there is shown an embodiment of three quad pack type chips ready for interconnection of corresponding leads. Some leads have been omitted from the diagram to provide a better illustration of the principles. As is evident if FIG. 11, normal chip 1101 will be mounted top side up on mounting board 1104 substantially above full mirror chip 1103 which will be mounted belly side up on the bottom of mounting board 1104. In this way common leads of normal chip 1101 and full mirror chip 1103 may be most easily connected through the board. Normal chip 1102 (which will be mounted belly side up on the bottom of mounting board 1104) may have its common leads interconnected with chips 1101 and 1103 by using the side-by-side techniques discussed earlier for interconnection with chip 1103 on the bottom of mounting board 1104. The techniques of this three-chip arrangement may be similarly applied with two chips on top of mounting board 1104 and one chip on the bottom. Furthermore, it is evident that this technique applies to all the chip types discussed herein as well as other chip types that may exist now or hereafter.

III. Applications of Techniques

While we have disclosed several techniques and embodiments for making and using mirror image chips, we shall provide several more illustrative embodiments that depend upon the prior disclosure to varying extents. Since these illustrative embodiments involve a more dense representation of chips, we begin by defining more simple representations of chips so that such representations can be used to describe illustrative embodiments. The representations are expressly described with respect to quad pack type packages but, as discussed earlier, the illustrations apply to all types of packages discussed herein or that may exist now or later. Furthermore, the representations indicate various alignments between side-by-side or top-over-bottom configurations. As discussed earlier, the inventive concepts apply equally to alignment configurations that are offset in one or more dimensions.

Figure 12:
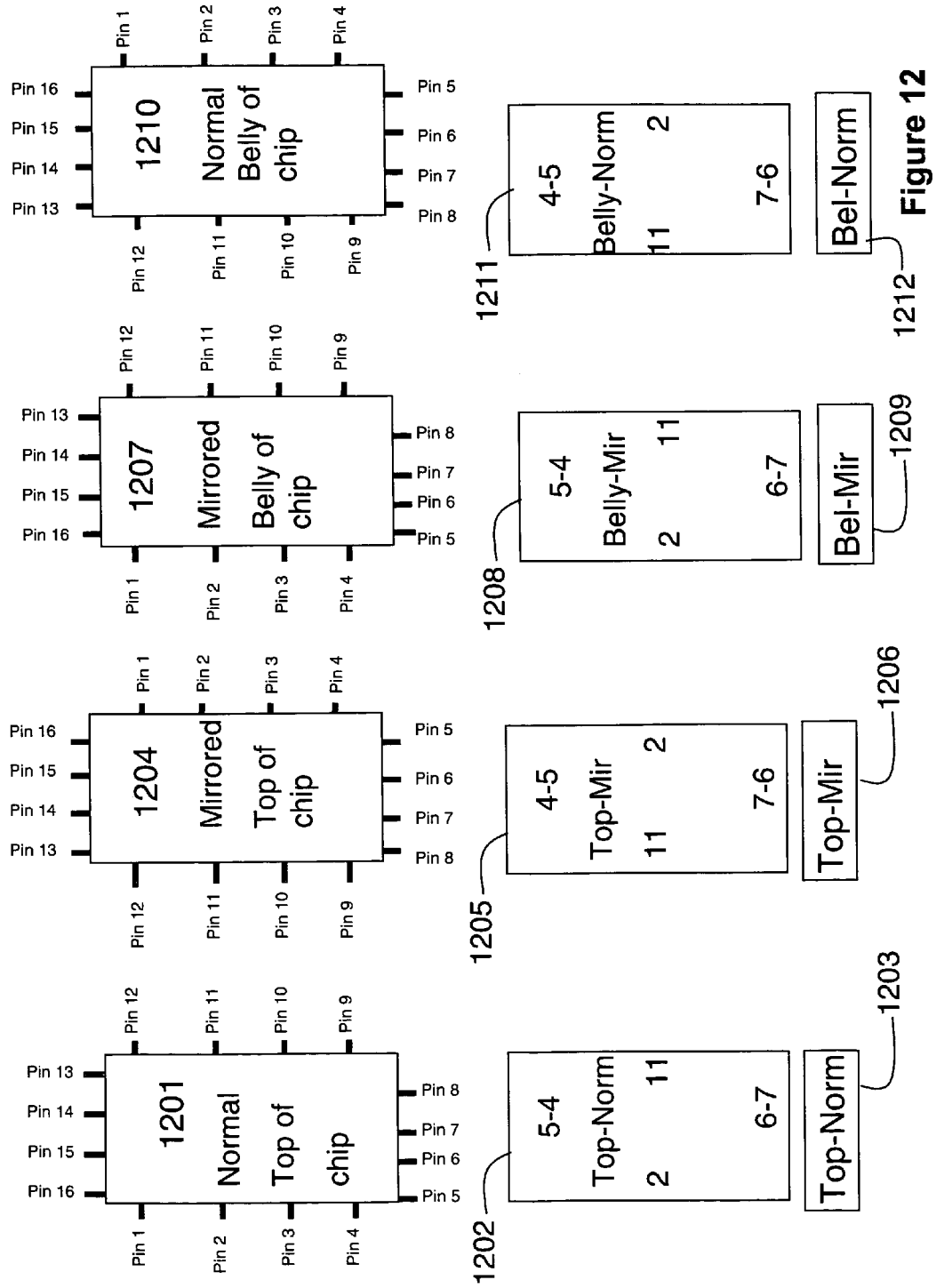
FIG. 12 is an example of devices and nomenclature

Referring to FIG. 12, chip 1201 is a top view of a quad pack type package with normal lead arrangement. When representing normal top of chip 1201, we shall use the "top-norm" designation as shown in either form of items 1202 or 1203. Referring to FIG. 12, chip 1204 is a top view of a quad pack type package with full mirror lead arrangement (as compared with chip 1201). When representing full mirror chip 1204, we shall use the "Top-mir" designation as shown in either form of items 1205 or 1206. Referring to FIG. 12, chip 1207 is a belly view of a quad pack type package with mirror lead arrangement (as compared with chip 1201). When representing mirrored belly view of chip 1207, we shall use the "Bel-mir" designation as shown in either form of items 1208 or 1209. Referring to FIG. 12, chip 1210 is a belly view of a quad pack type package with normal lead arrangement (as compared with chip 1201). When representing normal belly view of chip 1210, we shall use the "Bel-norm" designation as shown in either form of items 1211 or 1212.

Figure 13:
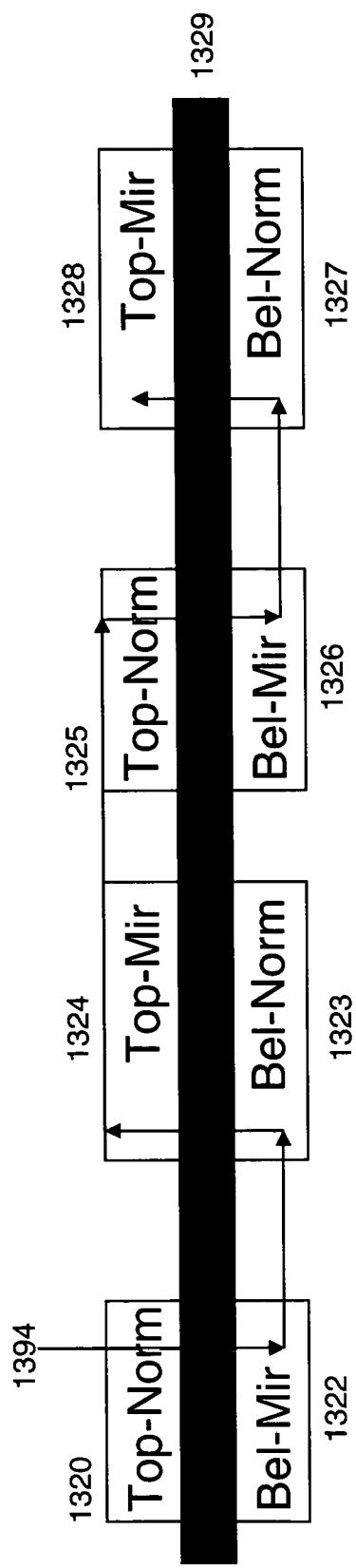
FIGS. 13A, 13B, 13C, 13D, 13E, 13F And 13G are examples of interconnection of devices according to some embodiments
Figure 13:
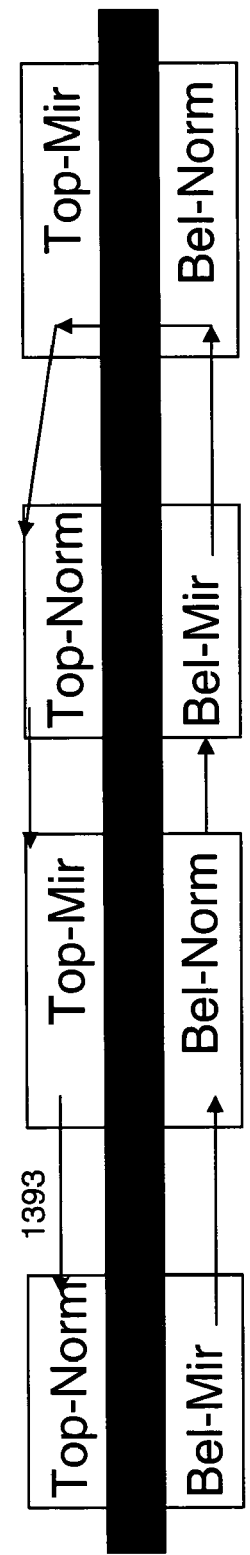

Referring now to FIG. 13A, there is shown a four chip configuration exploiting both normal and mirror chips. The chips 1301, 1303, 1304 and 1302 are shown joined by internal interconnects 1351, 1352, 1353 and 1354. Each interconnect shown is intended to represent as many interconnects as would be necessary to join desired corresponding leads. Furthermore, interconnects may also be formed on the outside of the chips as shown by interconnects 1354, 1355, 1356 and 1357. Depending upon the specific application, any number of the shown interconnects may be unnecessary. In addition, a number of additional interconnects may be necessary if every corresponding lead on every chip must be directly interconnected. It is also noteworthy that the identical interconnections techniques may be used to add any number of additional chips to that shown in FIG. 13A. The chips would be added in the pattern indicated. In particular, in one larger-chip embodiment, each top-mir part should adjoin top-norm chip on both its longer lateral and shorter vertical sides. Stated alternatively, each top-norm chip should adjoin top-mir chips on both its longer lateral and shorter vertical sides.

Referring to FIG. 13B, there is shown a four chip configuration where line 1306 shows one possible interconnection scheme for this configuration. In particular, following line 1306, top-norm chip 1305 is interconnected through mounting board 1310, to bel-mir chip 1307. Bel-mir chip 1307 is then side-by-side interconnected with bel-norm chip 1308, which in turn is connected, through mounting board 1310, to top-mir chip 1309. In this fashion, all four chips may have any number of easily interconnected leads. Furthermore, either of chip 1305 or 1309 may be removed in order to effect a three chip configuration. FIGS. 13C, 13D and 13E show other possible interconnections indicated by lines 1390, 1391 and 1392 respectively. With the benefit of such disclosure, one skilled in the art should be able to configure other possible permutations within the intent and teaching of the diagrams and descriptions.

Referring now to FIGS. 13F and 13G, two further illustrations are provided for interconnecting mirrored chips with their normal counterparts. More particularly, FIG. 13F shows interconnections that alternate between traversing through mounting board 1329 and traversing across an upper or lower surface of said mounting board. Alternatively, FIG. 13G illustrates an interconnection that minimizes the traversals through a mounting board by maximally exploiting interconnections at the upper and lower surfaces. Depending upon the requirements of a specific design, one of these configurations may be preferable to another. Furthermore, the two techniques may be combined by interconnecting any number of chips across a surface before interconnecting through a mounting board.

Figure 14:
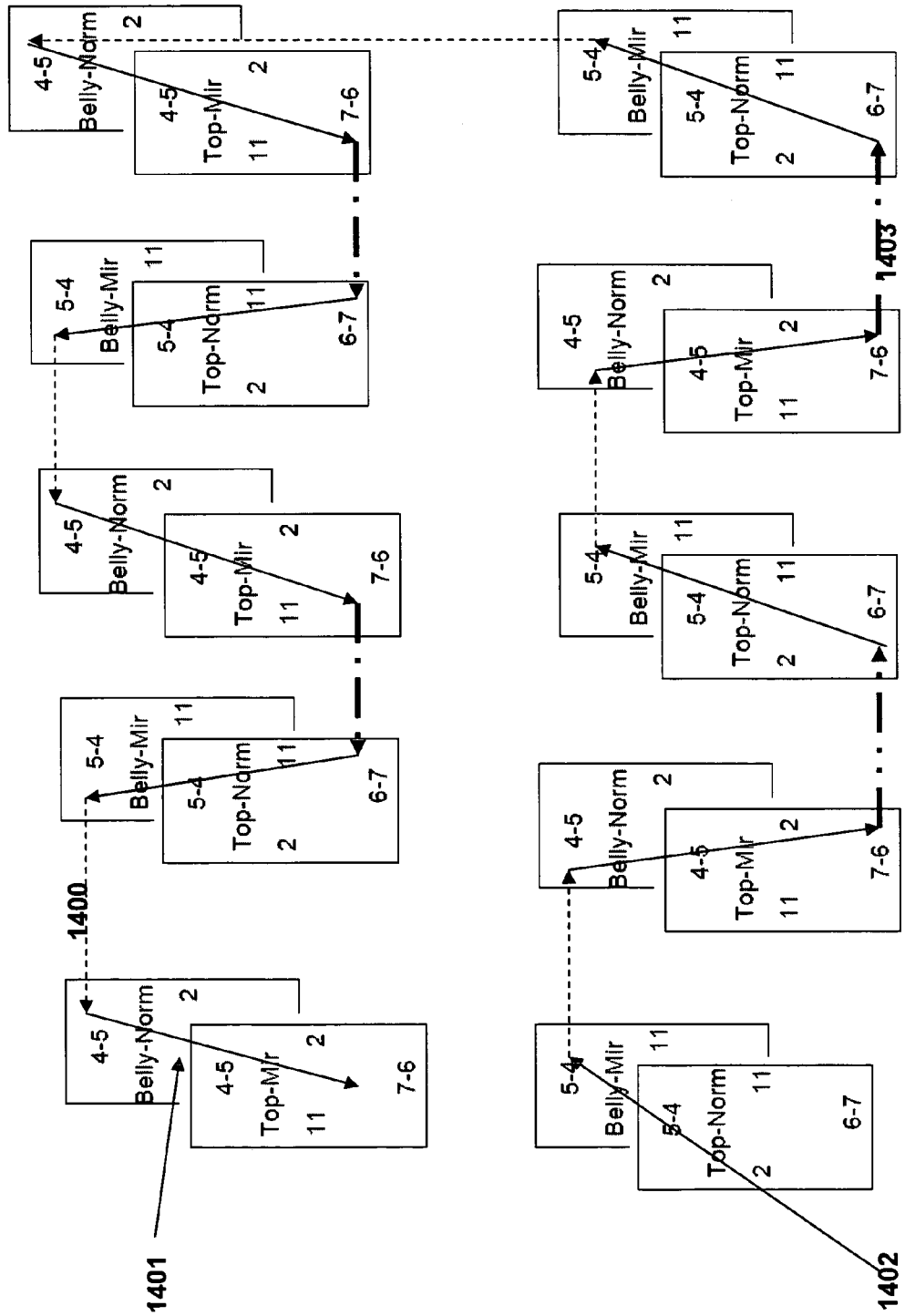
FIG. 14 is an example of interconnection of devices according to some embodiments

Referring now to FIG. 14, the interconnection of a double-sided multi-row chip arrangement is shown. For simplicity, there is no mounting board shown, but it should be assumed that one or more mounting boards exist between all the "top" chips and all the "belly" chips. Furthermore, for simplicity, each "top" chip is shown as two-dimensionally skewed from its corresponding "belly" chip. As discussed earlier, interconnected chips may be non-skewed, one dimensionally skewed or two-dimensionally skewed from each other. Also, in FIG. 14, pure dash lines such as 1400 represent side-by-side interconnection along the bottom surface of a mounting board; dash dot lines such as 1403 represent side-by-side interconnection along the top surface of a mounting board; and solid lines such as 1401 represent interconnection through a mounting board. The multi-chip arrangement shown in FIG. 14 may be grown by adding more chips using the same pattern. It may also be diminished by removing any number of chips without departing from the pattern.

Figure 15:
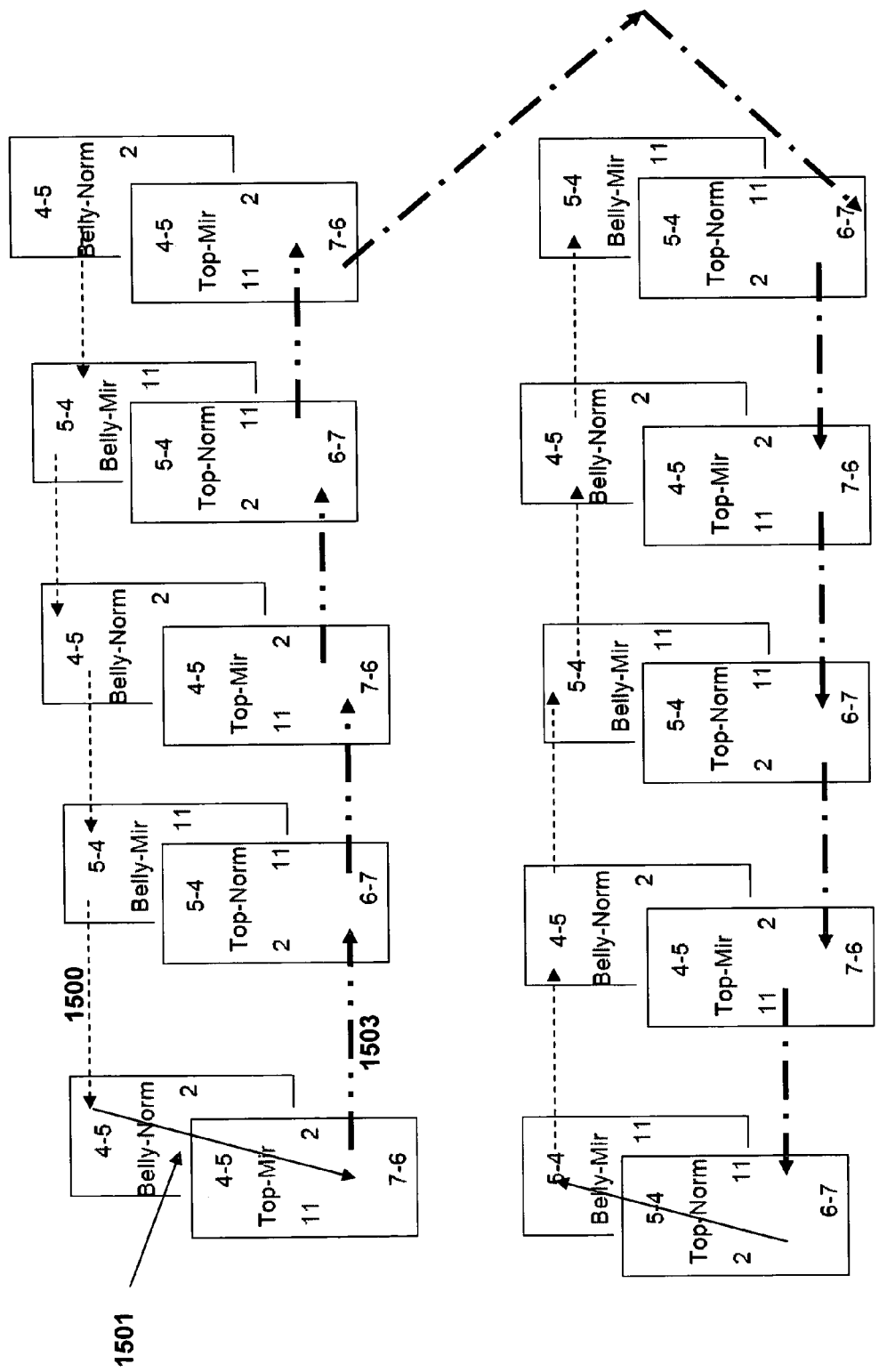
FIG. 15 is an example of interconnection of devices according to some embodiments
Figure 17:
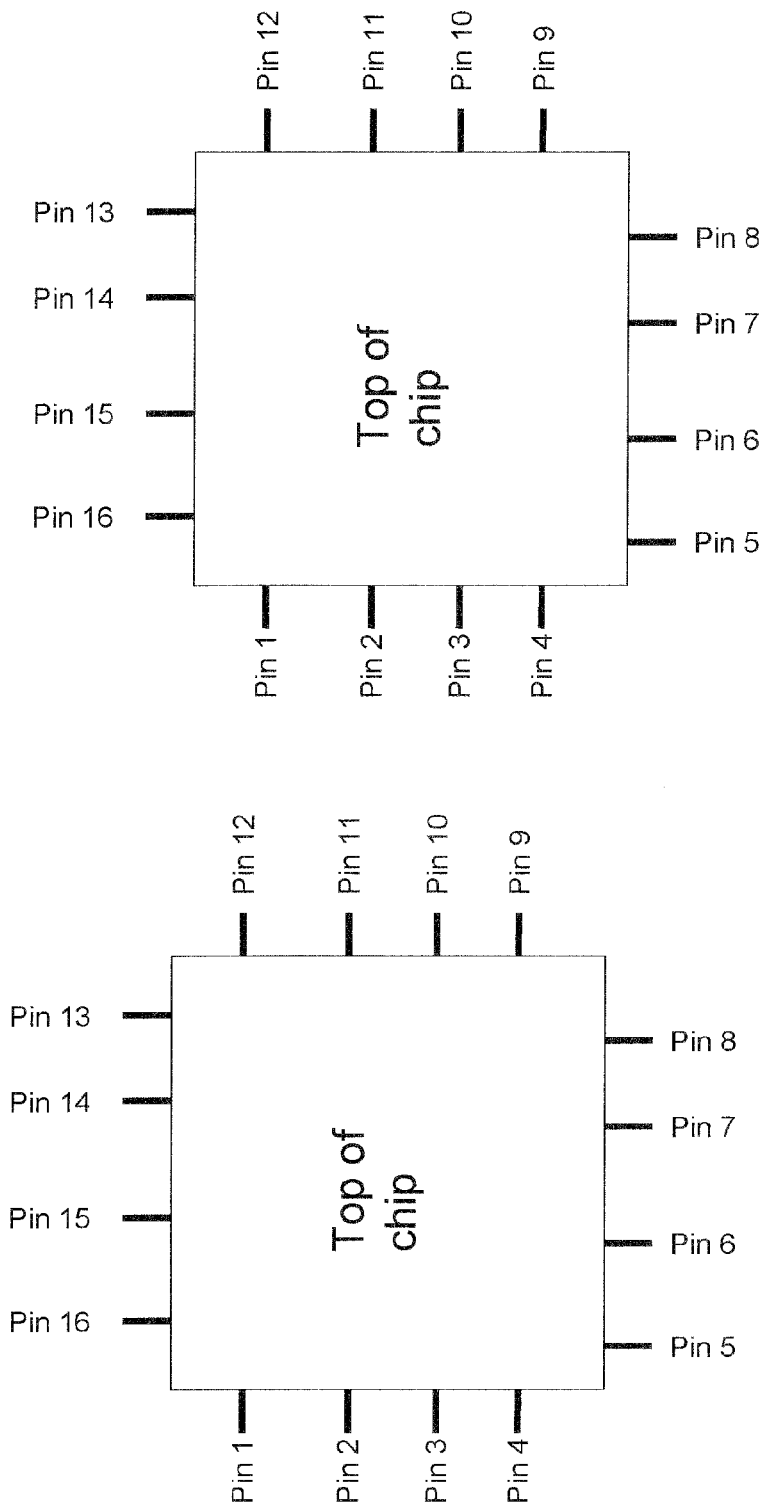
FIG. 17 is an example of prior art difficulties

Referring now to FIG. 15, the interconnection of a double-sided multi-row chip arrangement is shown. For simplicity, there is no mounting board shown, but it should be assumed that one or more mounting boards exist between all the "top" chips and all the "belly" chips. Furthermore, for simplicity, each "top" chip is shown as two-dimensionally skewed from its corresponding "belly" chip. As discussed earlier, interconnected chips may be non-skewed, one dimensionally skewed or two-dimensionally skewed from each other. Also, in FIG. 15, pure dash lines such as 1500 represent side-by-side interconnection along the bottom surface of a mounting board; dash dot lines such as 1503 represent side-by-side interconnection along the top surface of a mounting board; and solid lines such as 1501 represent interconnection through a mounting board. The multi-chip arrangement shown in FIG. 15 may be grown by adding more chips using the same pattern. It may also be diminished by removing any number of chips without departing from the pattern.

Comparing now the arrangements of FIGS. 14 and 15, we see that FIG. 14 shows interconnections that alternate between traversing through a mounting board (solid line) and traversing across an upper or lower surface of a mounting board (dash or dot dash lines). Alternatively, FIG. 15 illustrates an interconnection that minimizes the traversals through a mounting board by maximally exploiting interconnections at the upper and lower surfaces. Depending upon the requirements of a specific design, one of these configurations may be preferable to another. Furthermore, the two techniques may be combined by interconnecting any number of chips across a surface before interconnecting through a mounting board.

Referring now to FIG. 16, two alternative configurations are shown using the same line conventions as in FIGS. 14 and 15. While FIGS. 16A and 16B are illustrative in many ways, they particularly illustrate techniques for removing one chip from the internal portion of the pattern. Of course the same techniques may be used to eliminate any number of chips.

While there have been several embodiments disclosed and discussed, this disclosure is not intended to be limited to the details therein. One skilled in the art will recognize many applications and permutations not specifically disclosed, but enabled through this disclosure. In addition, the use of headings in this disclosure is not intended as limiting the applicability of any content described relative to a heading.

IV. Distinguishing Normal And Mirror Image Devices

We have discussing many embodiments for creating and using mirror image devices. On artifact of these new devices and uses is potential confusion between functionally identical chips that are pinned-out in full mirror fashion. Therefore, in some embodiments, color or insignia are used on the chip packaging to readily reveal the pin-out orientation. Most embodiments use color or insignia in addition to the normal alphanumeric writing on chips. As indicated, some embodiments use color, wherein the entire package or a portion thereof is color coded to distinguish normal from mirror packaging (e.g. blue for normal and red for mirrored). Similarly, patterning may be used such as cross-hatching and checker-boarding. In addition, any variety of human and/or machine readable insignia may be used, such as bar codes, 3D bar codes, shapes, colored shapes or simply prominent words ("MIRROR" or "NORMAL"). In some preferred embodiments, a human readable code such as a word (like "MIRROR") is combined with a machine readable code that incorporates more information than simply the pin-out status (e.g. one 3D bar code may reveal many things about the chip in addition to its pin-out version). In other preferred embodiments, there is used a single code that is both machine readable and easily indicative to a human. For example, color or letter may be readable by the particular equipment in question or there may be one or more 3D bar codes formed into the letters "M" or "N."

The invention claimed is:

1. A system of interconnected electrical devices, each electrical device having a polygon shape and electrical connectors, each said electrical connector having a specified purpose, said system comprising:

a first electrical device having a first arrangement of electrical connectors, said first electrical device mounted on a first side of a mounting board;

a second electrical device having a second arrangement of electrical connectors differing from said first arrangement, wherein a plurality of said second device's electrical connectors correspond to a plurality of said first device's electrical connectors, said correspondence indicated by having the same specified purpose, said second arrangement being a mirror image to said first arrangement in that said plurality of said second device's electrical connectors are arranged in a manner that is the mirror image of the corresponding connectors on said first electrical device; and a third electrical device having said second arrangement of electrical connectors, said second electrical device mounted adjacent to said first electrical device on the first side of said mounting board, said first device interconnected with said second device by interconnecting a first set of connectors on the surface level of said first side of said mounting board, said first set of connectors comprising one or more of said plurality of said second device's electrical connectors and the corresponding first device's electrical connectors; and said third electrical device mounted on a second side of said mounting board, said third electrical device interconnected with said first electrical device by interconnections through the mounting board and by a second set of connectors, said second set of connectors corresponding with said first set of connectors, wherein said first electrical device has connectors distributed on its underside.

2. The system of claim 1 wherein said first electrical device is a first type of polygon and said second electrical device is a second type of polygon, different from said first type.

3. The system of claim 1 wherein said first electrical device is generally rectangular and has connectors on only two sides.

4. The system of claim 1 wherein said first electrical device is generally rectangular and has connectors on four sides.

5. The system of claim 1 wherein said plurality of said second device's electrical connectors is all of said second devices electrical connectors.

6. The system of claim 1 wherein said first electrical device comprises a first die and said third electrical device comprises a third die and said first die is constructed the same as said third die.

7. The system of claim 6 wherein said first die and said third die each have a corresponding top and bottom, said first die being mounted in said first device and said third die being mounted in said third device, wherein the top of said first die faces the bottom of said third die.

8. A method for interconnecting electrical devices, each electrical device having a polygon shape and electrical connectors, each said electrical connector having a specified purpose, said method comprising the steps of:

mounting a first electrical device adjacent to a second electrical device, both mounted to a first side of a mounting board, said first electrical device having a first arrangement of electrical connectors, said second device having a second set of electrical connectors, wherein a plurality of said second device's electrical connectors correspond to a plurality of said first device's electrical connectors, said correspondence indicated by having the same specified purpose, said second arrangement different from said first arrangement and being a mirror image to said first arrangement in that said plurality of said second device's electrical connectors are arranged in a manner that is the mirror image of the corresponding connectors on said first electrical device;

mounting a third electrical device to a second side of said mounting board, said third electrical device having said second arrangement of electrical connectors;

interconnecting said first electrical device with said second electrical device by interconnecting a first set of connectors on the surface level of said first side of said mounting board, said first set of connectors comprising one or more of said plurality of said second device's electrical connectors and the corresponding first device's electrical connectors; and interconnecting said third electrical device with said first electrical device by interconnections through the mounting board and by a second set of connectors, said second set of connectors corresponding with said first set of connectors, wherein said first electrical device has connectors distributed on its underside.

9. The method of claim 8 wherein said first electrical device is a first type of polygon and said second electrical device is a second type of polygon.

10. The method of claim 8 wherein said first electrical device is generally rectangular and has connectors on only two sides.

11. The method of claim 8 wherein said first electrical device is generally rectangular and has connectors on four sides.

12. The method of claim 8 wherein said plurality of said second device's electrical connectors is all of said second devices electrical connectors.

13. The method of claim 8 wherein said first electrical device and said second electrical device derive functionality from identical dice.

14. A system of interconnected electrical devices, the system comprising:

a first electrical device mounted on a first side of a mounting board, the first electrical device having first electrical connectors in a first arrangement and distributed on its underside;

a second electrical device having second electrical connectors in a second arrangement, wherein a plurality of the second electrical connectors correspond to a plurality of the first electrical connectors such that the corresponding first and second electrical connectors have a same specified purpose, the second arrangement being a mirror image to the first arrangement in that the plurality of the second electrical connectors are arranged in a manner that is the mirror image of the corresponding first electrical connectors on the first electrical device; and a third electrical device having third electrical connectors in the second arrangement, wherein the second electrical device is mounted adjacent to the first electrical device on the first side of the mounting board, the first device interconnected with the second device by interconnections between a first set of the electrical connectors on the surface level of the first side of the mounting board, the first set comprising one or more of the plurality of the second electrical connectors and the corresponding first electrical connectors; and wherein the third electrical device is mounted on a second side of the mounting board, the third electrical device interconnected with the first electrical device by interconnections through the mounting board and by a second set of electrical connectors, the second set of electrical connectors corresponding with the first set of electrical connectors.

15. The system of claim 14, wherein the first electrical device is a first type of polygon and the second electrical device is a second type of polygon, different from the first type.

16. The system of claim 14, wherein the first electrical device is generally rectangular and has connectors on only two sides.

17. The system of claim 14, wherein the first electrical device is generally rectangular and has connectors on four sides.

18. The system of claim 14, wherein the plurality of the second electrical connectors is all of the second electrical connectors.

19. The system of claim 14, wherein the first electrical device comprises a first die, wherein the third electrical device comprises a third die, and wherein the first die is constructed the same as the third die.

20. The system of claim 19, wherein the first die and the third die each have a corresponding tops and bottoms, the first die being mounted in the first device and the third die being mounted in the third device, wherein the top of the first die faces the bottom of the third die.

21. A method for interconnecting electrical devices, the method comprising the steps of:

mounting a first electrical device adjacent to a second electrical device, both mounted to a first side of a mounting board, the first electrical device having first electrical connectors in a first arrangement and distributed on its underside, the second device having second electrical connectors in a second arrangement, wherein a plurality of the second electrical connectors correspond to a plurality of the first electrical connectors such that the corresponding first and second electrical connectors have a same specified purpose, the second arrangement being a mirror image to the first arrangement in that the plurality of the second electrical connectors are arranged in a manner that is the mirror image of the corresponding first electrical connectors on the first electrical device;

mounting a third electrical device to a second side of the mounting board, the third electrical device having third electrical connectors in the second arrangement;

interconnecting the first electrical device with the second electrical device by interconnecting a first set of the electrical connectors on the surface level of the first side of the mounting board, the first set comprising one or more of the plurality of the second electrical connectors and the corresponding first electrical connectors; and interconnecting the third electrical device with the first electrical device by interconnections through the mounting board and by a second set of the electrical connectors, the second set corresponding with the first set.

22. The method of claim 21, wherein the first electrical device is a first type of polygon and the second electrical device is a second type of polygon.

23. The method of claim 21, wherein the first electrical device is generally rectangular and has connectors on only two sides.

24. The method of claim 21, wherein the first electrical device is generally rectangular and has connectors on four sides.

25. The method of claim 21, wherein the plurality of the second electrical connectors is all of the second electrical connectors.

26. The method of claim 21, wherein the first electrical device and the second electrical device derive functionality from identical dice.

* * * * *